United States Patent [19]
Ohnishi et al.

[11] Patent Number: 5,473,280
[45] Date of Patent: Dec. 5, 1995

[54] MODULATION/DEMODULATION METHOD AND SYSTEM FOR REALIZING QUADRATURE MODULATION/DEMODULATION TECHNIQUE USED IN DIGITAL MOBILE RADIO SYSTEM WITH COMPLEX SIGNAL PROCESSING

[75] Inventors: Makoto Ohnishi, Tokyo; Masaaki Ohta, Zushi; Masaru Adachi, Kodaira, all of Japan

[73] Assignees: Hitachi, Ltd.; Hitachi Denshi Kabushiki Kaisha, both of Tokyo, Japan

[21] Appl. No.: 198,574

[22] Filed: Feb. 18, 1994

[30] Foreign Application Priority Data

Feb. 18, 1993 [JP] Japan .................................. 5-029375

[51] Int. Cl.[6] ................................................ H03D 3/00
[52] U.S. Cl. ........................................ 329/304; 329/305
[58] Field of Search ............................... 332/103, 104, 332/105; 329/304, 305, 310; 375/39, 67, 80, 83, 94, 261, 308, 324, 329, 340

[56] References Cited

U.S. PATENT DOCUMENTS 4,990,867  2/1991  Ogura et al. ........................ 332/102
5,172,070  12/1992  Hiraiwa et al. ...................... 329/304
5,179,360  1/1993  Suzuki ................................... 332/103

FOREIGN PATENT DOCUMENTS 0232664  9/1988  Japan .
0106188  5/1991  Japan .
0332214  11/1992  Japan .

*Primary Examiner*—Robert J. Pascal
*Assistant Examiner*—David H. Vu
*Attorney, Agent, or Firm*—Antonelli, Terry, Stout & Kraus

[57] ABSTRACT

In a complex modulation/demodulation method and system, the data frequency $f_{C1}$ of data signals I and Q inputted to a constellation mapping circuit is converted by a digital interpolation circuit into a sampling frequency $f_{C2}$ equal to $f_S/N$, where $f_S$ is an operation sampling frequency and N is selected such that the signal maximum frequency of the data signals I and Q becomes lower than $f_{C2}/2$. The interpolated data signals I and Q are respectively inputted to real and imaginary input terminals of a complex coefficient band pass filter to extract a real signal output. An output signal of the complex coefficient band pass filter is converted by a DA converter into an analog signal from which desired frequency components are extracted by an analog band pass filter, thereby performing a quadrature modulation.

16 Claims, 5 Drawing Sheets

MODULATION/DEMODULATION METHOD AND SYSTEM FOR REALIZING QUADRATURE MODULATION/DEMODULATION TECHNIQUE USED IN DIGITAL MOBILE RADIO SYSTEM WITH COMPLEX SIGNAL PROCESSING

BACKGROUND OF THE INVENTION

The present invention relates to a modulation/demodulation system, and more particularly to a complex signal modulation/demodulation method and system for realizing a quadrature modulation/demodulation technique used in a digital mobile radio system by a complex signal processing.

In recent years, a digital radio system has been investigated in order to enhance the reliability of mobile communication. In the digital radio system, a carrier signal is modulated by information data to be transmitted and the modulated signal is transmitted and received. Though there are various modulation systems, a quadrature modulation system is widely used. In the quadrature modulation system, the amplitude and phase of a carrier signal are both modulated. For this purpose, two components of a carrier signal, that is, the in-phase component (I) and the quadrature phase component (Q) thereof are modulated. Usually, two modulation signals used for modulating I and Q can be obtained by time-dividing a signal of one system.

FIG. 1 shows an example of the conventional quadrature modulation system constructed with analog circuits. In the figure, reference numeral 1 denotes a constellation mapping circuit, numerals 2 and 3 low pass filters (LPF's), numerals 4 and 5 frequency mixers, numeral 6 a 90° phase shifter, numeral 7 a carrier signal generator, and numeral 8 a signal adder. Data signals I and Q to be transmitted are inputted to the constellation mapping circuit 1 which in turn converts signals with logical levels of 0 and 1 into signals with amplitude levels of 1 and −1. The converted signals are subjected to a waveform shaping and band limitation process by the low pass filters 2 and 3, respectively. In the frequency mixers 5 and 4, the processed signals are respectively mixed with a quadrature phase carrier signal which is generated from the carrier signal generator 7 and an in-phase carrier signal which is obtained by inputting the quadrature phase carrier signal to the 90° phase shifter 6. Then, the mixed signals are added together by the signal adder 8, thereby performing a quadrature modulation. A quadrature demodulation can be realized by performing an operation reverse to that in the quadrature modulation shown in FIG. 1.

In recent years, an attempt to construct a quadrature modulator/demodulator with digital circuits has been made owing to the advance of digital circuit technology. A construction in the case of a digital processing is substantially the same as that in FIG. 1 but has additionally a digital-to-analog (DA) converter and an analog filter (for elimination of the aliasing component of a digital signal) at the final output stage.

The prior art relevant to the quadrature modulator/demodulator includes JP-A-3-106188.

SUMMARY OF THE INVENTION

The above-mentioned conventional quadrature modulation system constructed with analog circuits has the problem of deviation of modulation signal circuits (low pass filters, frequency mixers and 90° phase shifter) for I and Q which includes amplitude deviation, DC offset and phase error for I and Q. The circuit deviation has a frequency and signal level dependency and causes non-uniform variations due to physical environmental conditions such as change with the lapse of time, temperature, power supply voltage, and so on. Further, there is a problem that non-linear circuit components included in the frequency mixers generate intermodulation distortion, for example.

On the other hand, the digital system can eliminate the circuit deviation in the analog system. However, in many cases, a digital signal processing requires the conversion of a sampling frequency, and the sampling frequency of a signal and the operation sampling frequency of the circuit are different. In such a case, it is necessary to make the operation sampling frequency of the digital circuit several or more times as high as a carrier frequency. Accordingly, there is a problem that the system is restricted to applications in which the carrier frequency is low. Also, in the digital system, a relationship between the circuit operation sampling frequency and the carrier frequency is fixed to a integer ratio, which places a restriction on the degree of freedom of design. Further, a method, in which the construction shown in FIG. 1 is merely implemented in a digital form as it is, includes a drawback that the construction of a carrier signal generator and frequency mixers becomes complicated.

An object of the present invention is to provide a circuit construction in which the problem of circuit deviation in analog circuits is avoided and a carrier signal generator, frequency mixers and so on which would otherwise have to be implemented in digital form are not required.

Another object of the present invention is to provide a circuit system in which a relationship between the circuit operation sampling frequency and the carrier frequency is not limited to an integer ratio, thereby improving the degree of freedom of design.

A further object of the present invention is to provide means for overcoming a drawback which offers a problem in digitization or the drawback that the sampling frequency becomes high.

To that end, according to one aspect of the present invention, a quadrature modulated signal is generated directly by use of a digital complex coefficient band pass filter with in-phase and quadrature phase signal components I and Q taken as the real and imaginary signal components of a complex signal.

A specific modulation method includes a step of inputting a modulation data signal of a signal band $2f_B$ having a carrier frequency $f_C$ and a sampling frequency $f_D$, $2f_B$ being smaller than $f_D$, a step of filtering the modulation data signal with a digital complex coefficient band pass filter which has a frequency characteristic including a pass (or transmission) band of $2f_B$ with a center frequency $f_O=f_C$ and operates at a sampling frequency of $f_S = Nf_O$, N being an integer not smaller than 3, a step of digital converting the real and imaginary part outputs of the digital complex coefficient band pass filter into an analog signal with a digital-to-analog converter or the like, and a step of extracting frequency components in the range of $f_C-f_B$ to $f_C+f_B$ with an analog band pass filter or the like to obtain a quadrature modulated signal.

A demodulation method includes a step of extracting a signal, in which a carrier with a frequency of $f_C$ is quadrature-modulated by a modulation data signal of a signal band $2f_B$ ($2f_B<f_C$), from a received signal with an analog band pass filter, a step of converting the quadrature modulated signal into a digital signal with an analog-to-digital converter, a step of filtering the digital signal with a digital complex coefficient band pass filter which has a frequency characteristic including a pass band of $2f_B$ with a center frequency $f_O=f_C$ and operates at the sampling frequency of $f_S=Nf_O$, being an integer not smaller than 3, and a step of decreasing the sampling frequency of a real part output or imaginary part output of the digital complex coefficient band pass filter to $f_C$ to quadrature-demodulate the quadrature modulated signal.

It is preferable that in the case where the sampling frequency $f_D$ of the modulation data signal is different from the carrier frequency $f_C$ ($f_D \neq f_C$), the modulation/demodulation processing is performed with the sampling frequency $f_D$ of the modulation data signal being converted into $f_C$, for example, in such a manner that a digital sampling frequency converter is inserted at a stage before and after the digital complex coefficient band pass filter.

It is also preferable that the modulation/demodulation processing is performed by extracting a signal having frequency components of $f_C-f_B$ to $f_C+f_B$ among higher harmonic components of the sampling signal with the analog band pass filter with a relationship of $f_C = Mf_S \pm f_O$ (M: a positive integer) being established between the carrier frequency $f_C$ and the sampling frequency $f_S$ of the complex coefficient band pass digital filter. In this case, it is preferable that the operation duty ratio of the digital-to-analog converter is selected to be a value smaller than 1.

DESCRIPTION OF THE PREFERRED EMBODIMENTS

Embodiments of the present invention will now be explained using the accompanying drawings.

Figure 1:
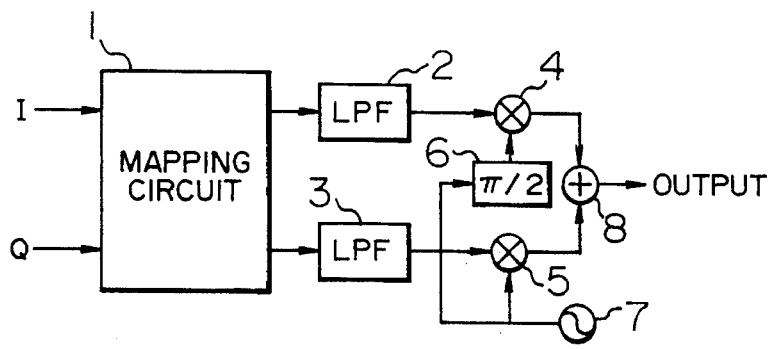
FIG. 1 is a block diagram of the conventional quadrature modulation system.
Figure 2:
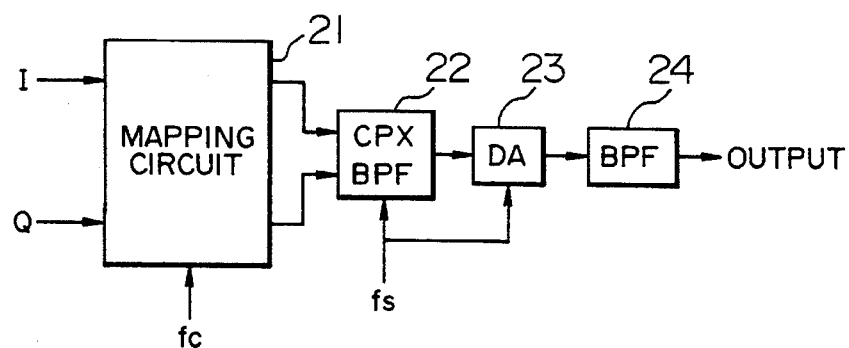
FIG. 2 is a block diagram for explaining the principle of a complex signal modulator according to the present invention.

FIG. 2 shows an embodiment of a fundamental modulator. In the figure, reference numeral 21 denotes a constellation mapping circuit, numeral 22 a digital complex coefficient band pass filter, numeral 23 a DA converter, and numeral 24 an analog band pass filter.

The operation of the construction shown in FIG. 2 will now be explained referring to operation spectra shown in FIGS. 3A to 3C. In-phase data I and quadrature phase data Q are converted by the constellation mapping circuit 21 from data of logical levels 0 and 1 to data of amplitude levels of +1 and −1 and are then inputted to the digital complex coefficient band pass filter 22.

Figures 3A, 3B, 3C:
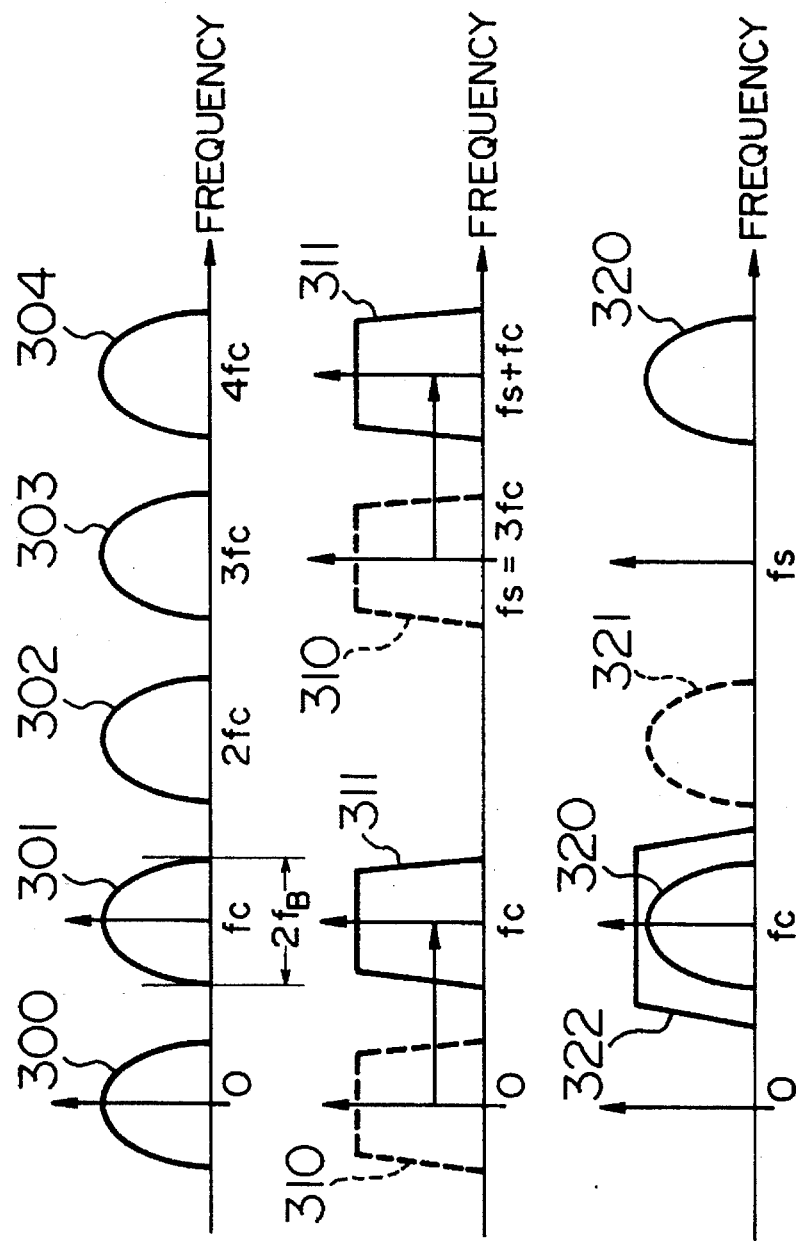
FIGS. 3A to 3C are modulation spectrum diagrams for explaining the principle of a complex signal modulation/demodulation system of the present invention.

FIG. 3A shows an output signal of the constellation mapping circuit 21. The sampling frequency of I and Q is selected to be $f_C$ which is the same as an output carrier frequency. The same pattern of spectrum cyclically appears with a period equal to the sampling frequency $f_C$. Namely, as shown in FIG. 3A, the signal includes high frequency components 301 to 304 which are an integer times as high as $f_C$ and each of these components has the same spectrum as that of a signal 300 at f=0.

FIG. 3B shows the characteristic of the complex coefficient band pass filter 22. The sampling frequency $f_S$ of the complex coefficient band pass filter 22 is selected to be $3f_C$. The complex coefficient band pass filter 22 too has a period equal to the sampling frequency $f_S$. The complex coefficient band pass filter 22 has a frequency characteristic 311 in which a real coefficient low pass filter with a cut-off frequency $f_B$ as shown by dotted line 310 in FIG. 3B is frequency-shifted by $f_C$.

The principle of the complex coefficient band pass filter will be explained. In general, a z operator of the transfer function H(z) of a digital filter represents a time delay of a sampling period $T=1/f_S$ or is represented by $$z = e^{i\omega T} = e^{i2\pi f/f_S}.$$

Since z is a periodic function, a frequency characteristic of the filter exhibits the same characteristic which cyclically appears with a period equal to $f_S$. By thereafter shifting the frequency f of z by $f_a$, there is obtained $$z' = e^{i2\pi(f-f_a)/f_S} = \alpha z$$

where $\alpha$ is generally a complex number. By introducing $z'$ for H(z), H($\alpha z$) or a complex coefficient filter is obtained. Since $|\alpha|=1$, the filter has a characteristic which has an unchanged amplitude and a frequency shifted by $f_a$. If $f_a$ is made equal to $f_S/2$, there results in $\alpha=1$ or no complex efficient filter is provided. In order to obtain a filter with a complex coefficient by frequency shift, it is necessary to make $f_S$ not smaller than $3f_C$.

Next, a processing for the output of the complex coefficient band pass filter 22 will be explained using FIG. 3C. The output of the complex coefficient band pass filter 22 includes a complex signal 320 having a spectrum shown by solid line in FIG. 3C. A real part component of the complex signal is extracted and is then converted into an analog signal by the DA converter 23. In a complex signal, the frequency has a distinction between positiveness and negativeness. However, by provision of a real signal, the distinction in frequency between positiveness and negativeness is extinguished. Therefore, an aliasing component 321 shown by dotted line in FIG. 3C appears in the spectrum. By extracting components in the vicinity of the frequency $f_C$ by the analog band pass filter 24 (the characteristic of which is shown by reference numeral 322), a desired quadrature modulated signal free of the aliasing component 321 can be obtained.

The construction shown in FIG. 2 does not require a carrier signal generator, frequency mixers and so on which are required in the conventional construction based on an analog processing. However, the carrier frequency and the operation sampling frequency of the filter are restricted to a relationship of integer times therebetween. In order to overcome this restriction, a sampling frequency converter is disposed between the constellation mapping circuit 21 and the complex coefficient band pass filter 22 in the construction of FIG. 2 to convert the data rate $f_D$ into the carrier frequency $f_C$. For this purpose, there is required a circuit which can convert the sampling frequency at any conversion ratio. Therefore, a digital interpolation circuit including a time-varying coefficient filter is used.

The details of an interpolation circuit including a time-varying coefficient filter are disclosed by, for example, JP-A-4-332214.

Figure 4:
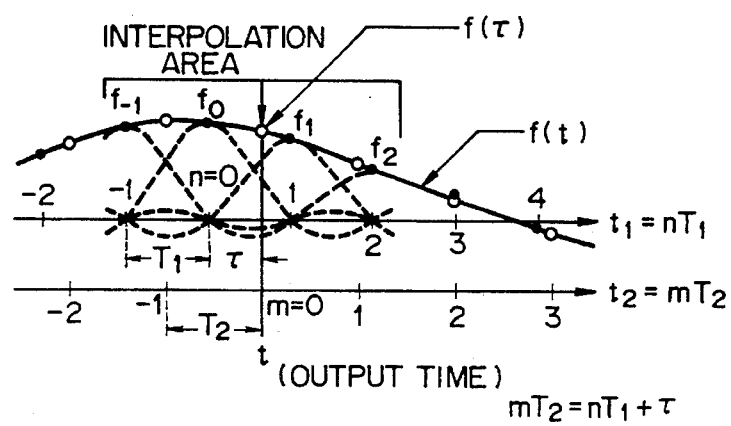
FIG. 4 is a diagram for explaining the principle of digital interpolation used in the present invention.

The principle of the interpolation (or sampling frequency conversion) will be explained using FIG. 4. From data train $f(nT_1)$ sampled at a period $T_1$, indicated by filled circles in FIG. 4, the original time function $f(t)$ can be represented by $$f(t) = \Sigma f(nT) \text{Sinc}\{\pi(t - nT_1)/T_1\} \quad (1)$$
$$= \Sigma f(nT_1) Sc(n, \tau).$$

using $\text{Sinc}(t)=(\sin t)/t$ (shown by dotted line in FIG. 4). As shown, $\text{Sinc}(t)$ is a laterally symmetrical curve and takes the value of 0 at $t=n\pi$ (n: a integer other than 0) and the value of 1 at $t=0$, where $\tau=t/T_1$ is a fraction when an output instant t is measured in terms of a $T_1$ period.

Equation (1) shows that when a data value at an instant t is predicted by the linear combination of discrete data $f(nT_1)$, a coupling coefficient $Sc(n, \tau)$ exhibits a function of t. A time-varying coefficient $Sc(n, \tau)$ exhibits a function having a property that it takes 1 at $t=nT_1$ and 0 at $t=mT_1$, where m is not equal to n and each of m and n is an integer. Various functions such as $\text{Sinc}(t)$ shown in equation (1) and Lagrange's interpolation polynominal used in numerical analysis can be employed for the time-varying coefficient. Also, equation (1) shows that when approximation using a finite number of data N is made, an interpolated value $f(t)$ is obtained as the output of a non-recursive or FIR (finite impulse response) filter having the time-varying coefficient $Sc(n, \tau)$. This shows that the interpolation or sampling frequency conversion can be realized as hardware by a time-varying coefficient filter. Parameters n and $\tau$, which define the time-varying coefficient $Sc(n, \tau)$, are represented by a data output instant of time t given by a sampling period $T_2$ of an output data train and represented by $$t=nT_1+\tau= mT_2. \quad (2)$$

Figure 5:
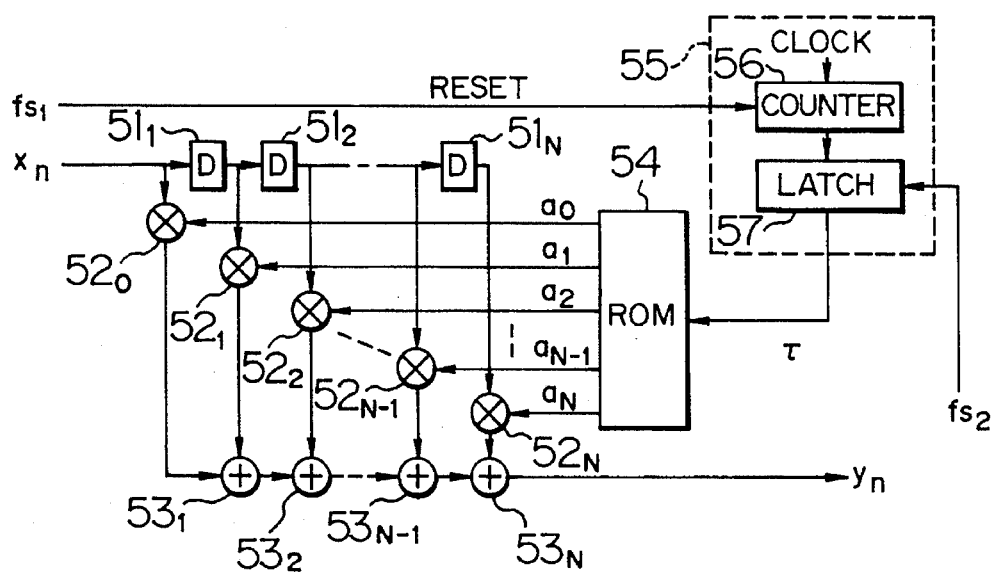
FIG. 5 is a block diagram of a digital interpolator.

FIG. 5 shows an example of the construction of the whole of the interpolation circuit. Reference numerals $51_1$ to $51_N$ denote delaying elements, numerals $52_0$ to $52_N$ coefficient multipliers, numerals $53_1$ to $53_N$ adder-subtracters, numeral 54 a ROM, numeral 55 a timer circuit, numeral 56 a counter, and numeral 57 a latch.

The timer circuit 55 for determining, which determines the interpolating instant t in equation (2) can be realized in such a manner that the counter 56 is inputted with clock pulses sufficiently faster than $T_1$ and is reset at the period of $T_1$ and the count value is read to the latch 57 at the period of $T_2$. By writing the time-varying coefficient $Sc(n, \tau)$ in the ROM 54 beforehand and reading it in accordance with the determined $\tau$ to provide the coefficient of the FIR filter, an interpolation circuit using a time-varying coefficient filter is realized.

If this sampling frequency converter is inserted before the complex coefficient band pass filter 22 shown in FIG. 2, it is possible to convert a signal with any data rate into a quadrature modulated signal.

As has been explained in the foregoing, in the quadrature modulation/demodulation based on the complex signal modulation/demodulation system of the present invention, since all circuits are constructed in a digital form, it is possible to completely avoid the problem of deviation of analog circuit elements. Also, the construction is facilitated since a carrier signal generator and frequency mixers are not required in contrast with the conventional digital system in which analog circuits are merely replaced by digital circuits. Further, since a relationship between an operation sampling frequency and a carrier frequency can be selected freely, restrictive conditions on design are moderated. The details of this embodiment will be explained later on using FIG. 8 in connection with a modulator and FIG. 6B in connection with a demodulator.

In general, a digital processing has a drawback that a carrier frequency for modulation/demodulation cannot be made high because of restrictions by an operation sampling frequency. If analog frequency conversion techniques are used, this drawback can be overcome easily but the circuit scale becomes large to some extent. Thus, if higher harmonic components generated in an AD/DA converter are extracted, it is possible to make the carrier frequency high to some extent while the operation sampling frequency of a digital circuit is kept low. This method can be realized easily in such a manner that the pass band of the analog band pass filter explained in reference to FIG. 3C is made high to extract higher harmonic components having a desired frequency. The details of this embodiment will be explained later on by use of FIGS. 9 and 10.

Figure 6A:
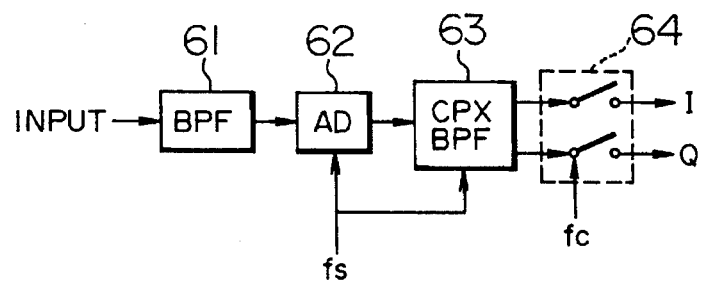
FIGS. 6A and 6B are block diagrams of a first embodiment and a modification thereof of the present invention, respectively.

FIG. 6A shows a fundamental embodiment of a demodulator of the present invention. Reference numeral 61 denotes an analog band pass filter, numeral 62 an AD converter, numeral 63 a complex coefficient band pass filter, and numeral 64 a resampling switch.

The operation of the demodulator can be explained as a sequence reversed version of the operation of the modulator shown in FIG. 2. Namely, a receiver input signal is passed through the analog band pass filter 61 to extract a desired signal. At this time, an intermediate frequency of the receiver input signal is selected to be $f_C$. Next, the signal is sampled by the AD converter 62, which operates at a sampling frequency $f_S$ integer times as high as $f_C$, and is then inputted to a real input terminal of the complex coefficient band pass filter 63. The complex coefficient band pass filter 63 can be constructed by frequency-shifting a real coefficient low pass filter with the same pass band width by $f_C$. If the sampling is made again by the resampling switch 64 for each $f_C$ while a real part signal and an imaginary part signal obtained in an output of the complex coefficient band pass filter 63 are respectively taken as an in-phase signal and a quadrature phase signal, quadrature modulated signals I and Q frequency-converted to a base band at the sampling frequency $f_C$ are obtained, thereby making it possible to realize a quadrature demodulation based on a complex signal processing.

Features of the construction shown in FIG. 6A lie in that a local carrier oscillator and a 90° phase shifter are not required and that one AD converter suffices. Owing to these features, the problem of deviation of circuit elements, in the case where the construction is realized by analog circuits, can be avoided and a quadrature modulator/demodulator can be realized with a small circuit scale since the use of a local carrier oscillator and a 90° phase shifter is not required.

Figure 6B:
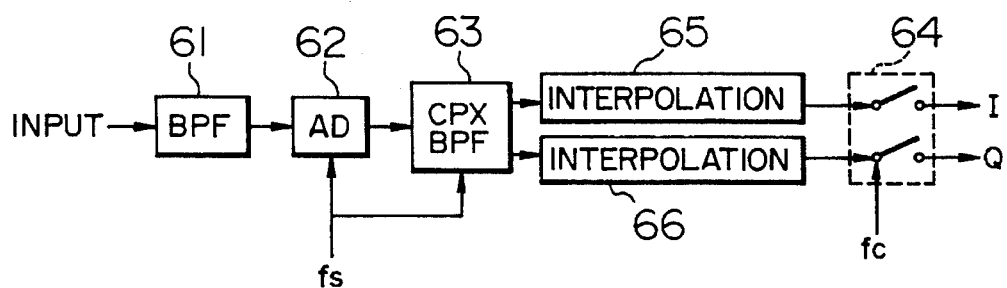

Though the complex coefficient band pass filter used in the embodiment shown in FIG. 6A and an embodiment shown in FIG. 6B (which has interpolation circuits 65 and 66 disposed between the complex coefficient band pass filter 63 and the resampling switch 64 of the demodulator shown in FIG. 6A) can be designed by frequency-shifting the frequency characteristic of a real coefficient low pass filter, the construction is facilitated, particularly, when the intermediate frequency $f_C$ of a pass band is ¼ of the operation sampling frequency $f_S$. The transfer function of a finite impulse response (FIR) type real coefficient filter is given by $$H(z)=a_0+a_1z^{-1}+a_2z^{-2}+a_3z^{-3}+a_4z^{-4}+a_5z^{-5} \cdots a_{N-1}z^{-N+1}+a_Nz^{-N} \quad (3)$$

where $z=\exp(j2 f/f_S)$ in equation (3) represents a delay of one sampling period. The transfer function of a filter obtained by frequency-shifting the frequency characteristic of equation (3) by $f_S/4$ can be calculated by substituting $f-f_S/4$ for $f$ in $z$ to provide $z'= \exp(j2\pi(f-f_S/4)/f_S)=\exp(j2\pi f/f_S).\exp(-2\pi/4)=-jz$. By introducing $z'$ into equation (3) and representing a real part and an imaginary part separately, one obtains $$HR(z)=a_0-a_2z^{-2}+a_4z^{-4} - \cdots +a_{N-1}z^{-N+1} \quad jHi(z)=a_1z^{-1}-a_3z^{-3}+a_5z^{-5}- \cdots a_Nz^{-N} \quad (4)$$

where $z'$ is replaced by $z$ and $N+1$ is a multiple of 4. Namely, in the case of $f_C=f_S/4$, the coefficient of a complex coefficient filter is a real number or a pure imaginary number and the number of filter coefficients is unchanged from that of the original real coefficient filter. This means that the amount of constituent elements is not changed even if the modification to the complex coefficient filter is made.

Figure 7A:
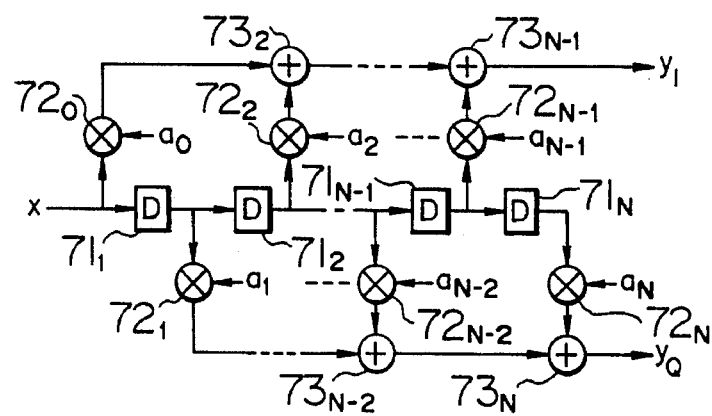
FIGS. 7A and 7B are diagrams for explaining complex coefficient filters which can be used in the present invention.
Figure 7B:
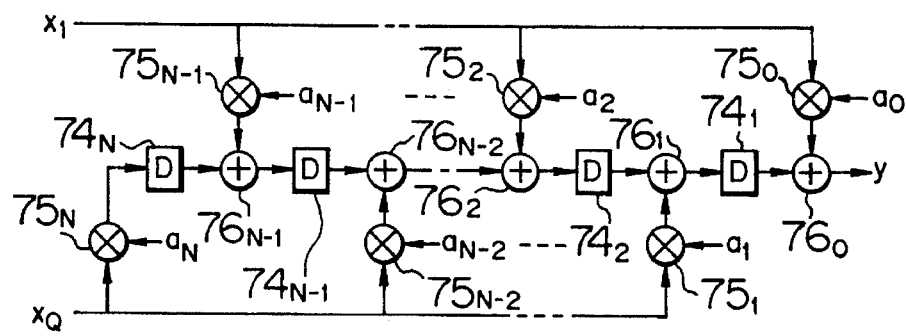

FIGS. 7A and 7B show embodiments of a digital complex coefficient filters provided by equation (4). In the figures, reference numerals $71_1$ to $71_N$ and $74_1$ to $74_N$ denote delaying elements, $72_0$ to $72_N$ and $75_0$ to $75_N$ coefficient multipliers, and numerals $73_2$ to $73_N$ and $76_0$ to $76_{N-1}$ adder-subtracters.

In the complex coefficient filter shown in FIG. 7A, only a real signal input terminal is provided and one train or set of delaying elements $71_1$ to $71_N$ suffices. The complex coefficient filter shown in FIG. 7A can be used as the complex coefficient band pass filter 63 in the embodiments of the quadrature demodulator shown in FIGS. 6A and 6B.

The complex coefficient filter shown in FIG. 7B has a complex signal input and a real signal output. This complex coefficient filter can be used for a quadrature modulator as shown in FIG. 2.

In the above-mentioned embodiments, it is necessary that the sampling frequency $f_S$ is integer times as high as the carrier frequency $f_C$.

Figure 8:
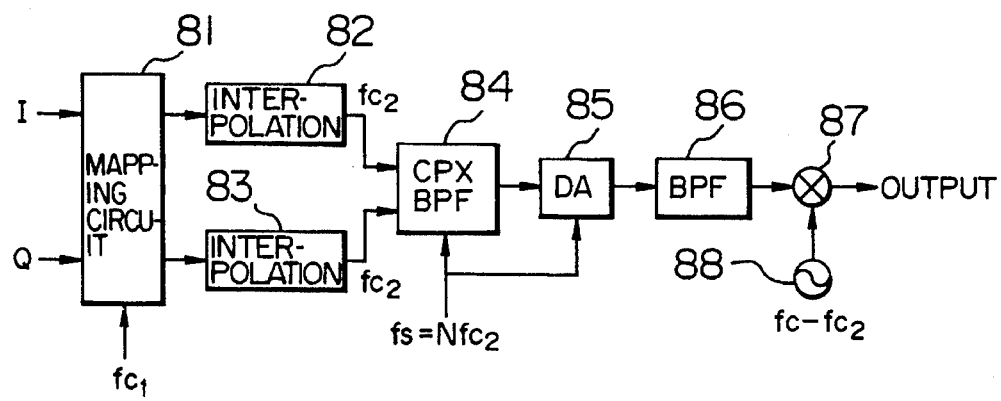
FIG. 8 is a block diagram of a second embodiment of the present invention.

FIG. 8 shows a second embodiment of the present invention which can eliminate the above requirement. In the embodiment shown in FIG. 8, the present invention is applied to a quadrature modulator.

In FIG. 8, reference numeral 81 denotes a constellation mapping circuit, numerals 82 and 83 digital interpolation circuits, numeral 84 a complex coefficient band pass filter, numeral 85 a DA converter, numeral 86 an analog band pass filter, numeral 87 a frequency mixer, and numeral 88 an intermediate local signal generator.

It is assumed that the data frequency of data signals I and Q inputted to the constellation mapping circuit 81 is $f_{C1}$ and is free of the integer ratio relation thereof with the operation sampling frequency $f_S$. The frequency $f_{C1}$ is converted by the digital interpolation circuits 82 and 83 into a sampling frequency $f_{C2}$ which is equal to $f_S/N$, N being selected such that the signal highest frequency of the data signals I and Q is lower than $f_{C2}/2$. The operations of the circuit elements 84, 85 and 86 are similar to those of the corresponding circuit elements explained in conjunction with FIG. 2. More particularly, the interpolated data signal I and the interpolated data signal Q are inputted to a real input terminal and an imaginary input terminal of the complex coefficient filter 84 to extract a real signal output. An output signal of the complex coefficient filter 84 is converted by the DA converter 85 into an analog signal from which desired frequency components are extracted by the analog band pass filter 86, thereby performing a quadrature modulation.

The modulated signal is mixed with an intermediate local signal with the frequency of $f_C-f_{C2}$ derived from the intermediate local signal generator 88 for frequency conversion so that a modulated signal having a desired carrier frequency $f_C$ is obtained.

In the embodiment shown in FIG. 8, the analog frequency mixer is used. However, this frequency mixer is used not for quadrature modulation but for mere frequency conversion. Therefore, the problem of deviation of circuit elements between quadrature phase and in-phase signals and the problem of quadrature modulation distortion are not generated. Preferably, there is an advantage that the carrier frequency handled by the digital circuit is made low and the operation sampling frequency of the digital circuit is made low. By using the digital interpolator as in the present embodiment, any data frequency and any sampling frequency can be selected and the design of a quadrature modulator is facilitated.

FIG. 6B shows an embodiment of a demodulator in which signal frequencies are converted by interpolators 65 and 66. In the embodiment shown in FIG. 6A, it is necessary that the sampling frequency is integer times as high as the carrier frequency. However, in the embodiment shown in FIG. 6B, such a restriction can be eliminated.

Figure 9:
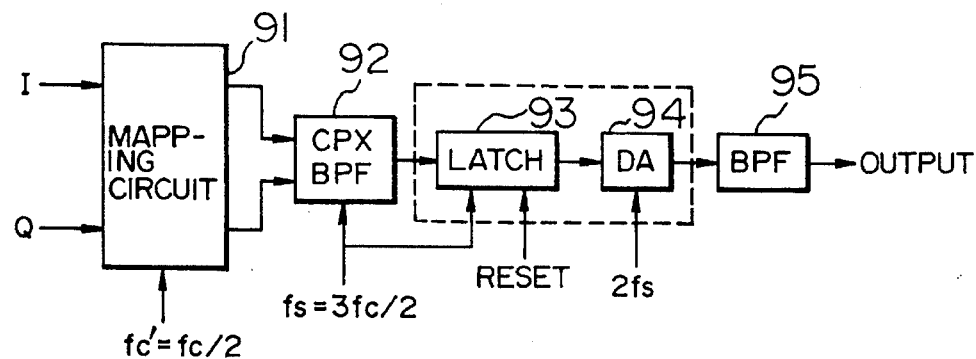
FIG. 9 is a block diagram of a third embodiment of the present invention.

FIG. 9 shows a further embodiment of the present invention. This embodiment is an embodiment of a quadrature modulation system in which a sampling frequency can be lowered by extracting higher harmonic components of a sampled signal. In FIG. 9, reference numeral 91 denotes a constellation mapping circuit, numeral 92 a complex coefficient band pass filter, numeral 93 a latch circuit, numeral 94 a DA converter, and numeral 95 an analog band pass filter.

FIGS. 11A to 11D show diagrams showing the operating waveforms of the embodiment shown in FIG. 9.

When a modulation carrier frequency is $f_C$, it is assumed that a sampling frequency $f_S$ is $f_S=(3/2)f_C$ and a modulation data rate is $f_C= f_C/2$. Modulation data I and Q are converted into amplitude value data by the constellation mapping circuit 91 (see FIG. 11B).

Figure 11A:
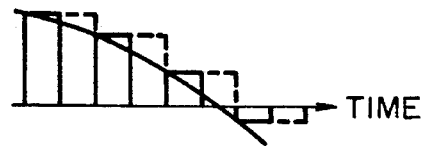
FIGS. 11A to 11D are diagrams showing signal waveforms for explaining the operation of the third embodiment of the present invention.
Figure 11B:
Figure 11C:
Figure 11D:
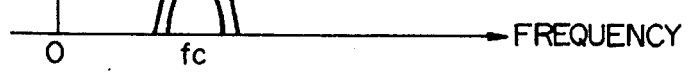

Next, the amplitude value data is converted by the complex coefficient band pass filter 92 into a complex band signal (see FIG. 11C).

Next, only a real signal output of the complex filter 92 is extracted and is held into the latch circuit 93. Since the latch circuit 93 is reset by a signal having a frequency which is twice as high as the sampling frequency $f_S$, an output of the DA converter 94 provides a pulse amplitude modulated waveform having a sampling frequency $f_S$ and a duty $d=0.5$ (see FIG. 11A).

It is known that when a signal having a frequency f is sampled by sampling pulses having a sampling frequency $f_S$ and a duty d, the amplitude of a sampled signal train is lowered to $$H(f)=\sin(2\pi df/f_S)/(2\pi df/f_S) \quad (5)$$

owing to the aperture effect.

As apparent from equation (5), a frequency characteristic when d=1 exhibits a curve 110 as shown in FIG. 11C and the frequency characteristic when d= 0.5 exhibits a curve 111. At f=$f_C$ in FIG. 11C, the value of equation (5) is 0.413 when d=1 and it is improved up to 0.827 when d=0.5. If components of f= $f_C$ are extracted from the output of the DA converter 94 by the analog band pass filter 95, it is possible to derive a desired modulated signal (see FIG. 11D).

Though FIG. 9 shows the embodiment in which the present invention is applied to a quadrature modulator, the present invention is also applicable to a quadrature demodulator.

Figure 10:
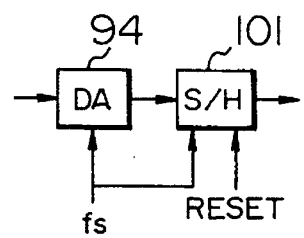
FIG. 10 is a block diagram of a fourth embodiment of the present invention.

FIG. 10 shows a still further embodiment of the present invention. The latch circuit 93 and the DA converter 94 in the embodiment shown in FIG. 9 equivalently realize a DA converter having the duty of 0.5. In the embodiment shown in FIG. 10, the DA converter with a duty changed in FIG. 9 is realized by another means. It is possible to form a quadrature modulator by substituting a construction of FIG. 10 for a portion which is enclosed by dotted line or includes the latch circuit 93 and the DA converter 94.

In FIG. 10, reference numeral 94 denotes a DA converter and numeral 101 denotes a sample/hold circuit. Each of the DA converter 94 and the sample/hold circuit 101 is operated at a sampling frequency $f_S$. The sample/hold circuit 101 has a reset terminal so that the duty of an output signal of the DA converter 94 can be changed arbitrarily, thereby enabling compensation for the aperture effect.

In the embodiment shown in FIG. 9 or 10, the compensation for the aperture effect is made by changing the pulse duty of the DA converter. However, it is also possible to make a complex filter have an aperture correcting frequency characteristic. In this case, such a frequency characteristic can be realized by designing a filter which has a characteristic reverse to that in equation (5). The embodiment shown in FIG. 9 or 10 has been explained in conjunction with the system in which higher harmonic components having a frequency twice as high as a sampling frequency are extracted. However, it is also possible to extract much higher-order harmonics. In this case, it is possible to further lower the sampling frequency for a carrier frequency.

The foregoing has been explained in conjunction with the embodiments of a quadrature modulation/demodulation system in which the digitization is easy. Though the foregoing embodiments have been explained in connection with either a quadrature modulator or a quadrature demodulator, the present invention is applicable to both the quadrature modulator and the quadrature demodulator.

According to the present invention, there is provided an advantage that since circuits including a local carrier generator, a 90° phase shifter and so on are not required, a quadrature modulator can be realized with a circuit scale which is small as compared with that in a method based on the conventional digital processing, and one AD/DA converter suffices. Also, there can be avoided the problem of deviation of circuit elements which is generated in a method based on an analog processing. Further, in a complex signal modulation/demodulation system using a digital interpolator according to the present invention, since a relationship between a carrier frequency and a sampling frequency can be selected freely, the degree of freedom of design is improved and the application to various systems becomes easy. In general, the digitization of a modulator/demodulator involves a problem that a sampling frequency required becomes high and the realization is difficult. However, in the embodiment of the present invention shown in FIG. 9 or 10, the processing of a quadrature modulated signal having a carrier frequency higher than a sampling frequency is enabled by extracting higher harmonics of a sampled signal.

What is claimed is:

1. A complex signal modulation method comprising the steps of:

inputting a modulation data signal having a signal band of $2f_B$, a carrier frequency $f_C$, and a sampling frequency $f_D$, $2f_B$ being smaller than $f_D$;

filtering said modulation data signal with a digital complex coefficient band pass filter which has a frequency characteristic including a pass band of $2f_B$ with a center frequency $f_0 = f_C$ and which operates at a sampling frequency $f_S = Nf_0$, N being an integer not smaller than 3;

converting a real part component and an imaginary part component output from said digital complex coefficient band pass filter into an analog signal with a digital-to-analog converter; and extracting frequency components in a range of $f_C - f_B$ to $f_C + f_B$ from said analog signal to obtain a quadrature-modulated signal.

2. A complex signal modulation method according to claim 1, further comprising the step of converting the sampling frequency $f_D$ of said modulation data signal to said carrier frequency $f_C$ before filtering the modulation data signal with the digital complex coefficient band pass filter.

3. A complex signal modulation method according to claim 1, wherein the step of extracting frequency components is performed by extracting a signal with frequency components of $f_C - f_B$ to $f_C + f_B$ among higher harmonic components of said analog signal with a relationship of $f_C = Mf_S \pm f_0$ (M: a positive integer) being established between said carrier frequency $f_C$ and the sampling frequency $f_S$ of said digital complex coefficient band pass filter.

4. A complex signal modulation method according to claim 3, wherein an operation duty ratio of said digital-to-analog converter is selected to be a value smaller than 1.

5. A complex signal demodulation method comprising the steps of:

extracting from a received signal a quadrature-modulated signal in which a carrier having a frequency $f_C$ is quadrature-modulated by a modulation data signal having a signal band of $2f_B$, $2f_B$ being smaller than $f_C$;

converting the quadrature-modulated signal into a digital signal with an analog-to-digital converter;

filtering said digital signal with a digital complex coefficient band pass filter which has a frequency characteristic including a pass band of $2f_B$ with a center frequency $f_0 = f_C$ and which operates at a sampling frequency $f_S = Nf_0$, N being an integer not smaller than 3; and decreasing a sampling frequency of a real part component or an imaginary part component output from said digital complex coefficient band pass filter to $f_C$ to quadrature-demodulate the quadrature-modulated signal.

6. A complex signal demodulation method according to claim 5, wherein the demodulation processing is performed with a sampling frequency $f_D$ of said modulation data signal being converted to $f_C$.

7. A complex signal demodulation method according to claim 6, wherein the demodulation processing is performed by extracting a signal with frequency components of $f_C - f_B$ to $f_C + f_B$ among higher harmonic components of the sampled signal with an analog band pass filter with a relationship of $f_C = Mf_S \pm f_0$ (M: a positive integer) being established between said carrier frequency $f_C$ and the sampling frequency $f_S$ of said digital complex coefficient band pass filter.

8. A complex signal demodulation method according to claim 7, wherein an operation duty ratio of said analog-to-digital converter is selected to be a value smaller than 1.

9. A complex signal modulation system comprising:

means for inputting a modulation data signal having a signal band of $2f_B$, a carrier frequency $f_C$, and a sampling frequency $f_D$, $2f_B$ being smaller than $f_D$;

means for filtering said modulation data signal, said filtering means including a digital complex coefficient band pass filter which has a frequency characteristic including a pass band of $2f_B$ with a center frequency $f_0=f_C$ and which operates at a sampling frequency $f_S=Nf_0$, N being an integer not smaller than 3;

digital-to-analog conversion means for converting a real part component and an imaginary part component output from said digital complex coefficient band pass filter into an analog signal; and means for extracting frequency components in a range of $f_C-f_B$ to $f_C+f_B$ from said analog signal to obtain a quadrature-modulated signal.

10. A complex signal modulation system according to claim 9, wherein said filtering means further includes means for converting the sampling frequency $f_D$ of said modulation data signal to said carrier frequency $f_C$;

wherein the digital complex coefficient band pass filter filters the modulation data signal after the sampling frequency $f_D$ of said modulation data signal has been converted to said carrier frequency $f_C$.

11. A complex signal modulation system according to claim 9, further comprising means for performing a modulation processing by extracting a signal with frequency components of $f_C-f_B$ to $f_C+f_B$ among higher harmonic components of said analog signal with a relationship of $f_C=Mf_S\pm f_0$ (M: a positive integer) being established between said carrier frequency $f_C$ and the sampling frequency $f_S$ of said digital complex coefficient band pass filter.

12. A complex signal modulation system according to claim 11, wherein an operation duty ratio of said digital-to-analog conversion means is selected to be a value smaller than 1.

13. A complex signal demodulation system comprising:

means for extracting from a received signal a quadrature-modulated signal in which a carrier having a frequency $f_C$ is quadrature-modulated by a modulation data signal having a signal band of $2f_B$, $2f_B$ being smaller than $f_C$;

analog-to-digital conversion means for converting the quadrature-modulated signal into a digital signal;

means for filtering said digital signal, said filtering means including a digital complex coefficient band pass filter which has a frequency characteristic including a pass band of $2f_B$ with a center frequency $f_0=f_C$ and which operates at a sampling frequency $f_S=Nf_0$, N being an integer not smaller than 3; and means for decreasing a sampling frequency of a real part component or an imaginary part component output from said digital complex coefficient band pass filter to $f_C$ to quadrature-demodulate the quadrature-modulated signal.

14. A complex signal demodulation system according to claim 13, wherein said means for decreasing includes means for converting a sampling frequency $f_D$ of said modulation data signal to $f_C$, the demodulation processing being performed with the sampling frequency $f_D$ of said modulation data signal being converted to $f_C$.

15. A complex signal demodulation system according to claim 14, wherein said demodulation processing means includes means for extracting a signal with frequency components of $f_C-f_B$ to $f_C+f_B$ among higher harmonic components of the sampled signal with said analog band pass filter with a relationship of $f_C=Mf_S\pm f_0$ (M: a positive integer) being established between said carrier frequency $f_C$ and the sampling frequency $f_S$ of said digital complex coefficient band pass filter.

16. A complex signal demodulation system according to claim 15, wherein an operation duty ratio of said analog-to-digital conversion means is selected to be a value smaller than 1.

* * * * *